(12) United States Patent
Tsai et al.

(10) Patent No.: US 6,361,911 B1
(45) Date of Patent: Mar. 26, 2002

(54) USING A DUMMY FRAME PATTERN TO IMPROVE CD CONTROL OF VSB E-BEAM EXPOSURE SYSTEM AND THE PROXIMITY EFFECT OF LASER BEAM EXPOSURE SYSTEM AND GAUSSIAN E-BEAM EXPOSURE SYSTEM

(75) Inventors: Fei-Gwo Tsai; Wei-Zen Chou, both of Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/550,268

(22) Filed: Apr. 17, 2000

(51) Int. Cl.⁷ .............................. G03F 9/00; G03C 5/00
(52) U.S. Cl. .......................... 430/30; 430/296; 430/942
(58) Field of Search ........................... 430/30, 296, 942

(56) References Cited

U.S. PATENT DOCUMENTS

| | | | |
|---|---|---|---|
| 5,217,831 A | 6/1993 | White | 430/5 |
| 5,254,438 A | 10/1993 | Owen et al. | 430/296 |
| 5,309,354 A | 5/1994 | Dick | 364/167.01 |
| 5,313,068 A | 5/1994 | Meiri et al. | 250/492.22 |
| 5,798,528 A | 8/1998 | Butsch et al. | 250/492.2 |
| 5,808,892 A | 9/1998 | Tu | 364/468.28 |
| 6,120,952 A | * 9/2000 | Pierrat et al. | 430/30 |

* cited by examiner

*Primary Examiner*—Christopher G. Young
(74) *Attorney, Agent, or Firm*—George O. Saile; Stephen B. Ackerman

(57) ABSTRACT

A new method is provided for E-beam exposure. A new method is provided for variable shaped E-beam (VSB) and Gaussian laser and E-beam exposure systems. The conventional main pattern is, under the method of the invention involving VSB, surrounded on all sides by a dummy frame whereby the dummy frame limits the beam size of the exposure shots that are adjacent to the main pattern. All patterns that are created in this manner are therefore composites using the same exposure shot. This improves the CD uniformity of the pattern by reducing the shot linearity error for VSB exposure systems. For Gaussian beam exposure systems, the exposure shots are at times located exactly over the exposed figure. Typically, gray level is used to simulate the small figure, this however induces proximity effects. The method of the invention therefore also improves the proximity effect of the Gaussian beam exposure systems.

3 Claims, 3 Drawing Sheets

USING A DUMMY FRAME PATTERN TO IMPROVE CD CONTROL OF VSB E-BEAM EXPOSURE SYSTEM AND THE PROXIMITY EFFECT OF LASER BEAM EXPOSURE SYSTEM AND GAUSSIAN E-BEAM EXPOSURE SYSTEM

BACKGROUND OF THE INVENTION (1) Field of the Invention

The invention relates to the fabrication of integrated circuit devices, and more particularly, to a method of improved Critical Dimension control for various E-beam and laser beam pattern exposure systems.

(2) Description of the Prior Art

The creation of semiconductor devices is critically dependent on the formation of numerous patterns that form device features while other patterns provide the means of interconnecting these device features. Photolithography has long been the mainstay technology that has been used for the creation of these patterns, the art of photolithography depends on transferring patterns that are contained in a mask onto a target surface whereby the most frequently used target surface is a layer of photoresist that is sensitive to impact of photo-electric energy. By placing a source of light behind the mask and exposing the layer of photoresist via the interception of the mask that contains the to be created pattern, the light that is provided by the light source only partially penetrates the mask and consequently only partially impacts the surface of the layer of photoresist. The chemical composition and molecular structure of the photoresist is changed due to the impact of the photo energy such that the impacted or non-impacted photoresist, dependant on whether the photoresist is positive or negative type photoresist, can be removed thereby leaving the pattern that is present in the exposure mask imprinted and reflected in the layer of photoresist. The remaining photoresist can then be used to shield an underlying layer of material, such as conductive materials, to create a desired pattern in these materials. It is well known in the art that for instance patterns of interconnect metal lines can be created in this manner.

The methods of creating images onto a target surface have been expanded to where not only visible or ultraviolet light energy is used for the exposure of the layer of photoresist (optical lithography using proximity or projection exposure) but where other sources of energy, such as electron beam projection, ion bombardment and X-rays can also be used as the source of energy.

Electron beam exposure and laser beam scanning have initially been applied for the creation of masks that are used for photolithographic exposures. The process of creating patterns whereby a photolithographic mask is used depends on accurate and easy alignment of the mask with underlying target surfaces, this in order to enable accurate exposure in a readily reproducible and repeatable manner. Since the image that is contained in the mask is projected onto a target surface, the method whereby the mask image is projected onto the target surface is frequently referred to as projection printing. These photolithographic technologies have advanced from earlier methods of proximity printing using a negative photoresist to methods of projection printing using a positive photoresist and a wafer stepper.

The methods of photolithographic are simple to apply but suffer from defect formation for methods where the mask is in direct contact with the wafer onto which an image is to be created. This contact is cause for high mask damage resulting in the requirement for frequent mask replacement. The major advantage of direct contact printing is that it offers high resolution, for shrinking device features contact printing becomes less attractive due to among others the impact that the (relatively larger) thickness of the layer of photoresist has on image resolution and critical dimensions of pattern images. Proximity printing offers the advantage of decreased mask damage, this advantage however is obtained at the cost of reduced image resolution.

Two of the more important parameters that apply to image creation are the Depth Of Focus (DOF) that can be achieved using a particular technology and the therewith corresponding Numerical Aperture (NA). For high feature resolution it is required that the DOF parameter is as large as possible, which implies that NA must be relatively large since the DOF is inversely proportional to $(NA)^2$. There is however a compromise that must be made between the values of DOF and NA. For narrow line width, NA must be large since the line width is inversely proportional to the NA. This would lead to the conclusion that a (very) large value of NA leads to dense feature or line patterns. A relatively large value for NA however decreases the value of DOF to the point where image resolution suffers. This then leads to the conclusion that an optimum (relatively high) value for NA must be selected such that the DOF is still acceptable, bringing small feature size in balance with acceptable feature resolution. The wavelength of the light source that is used to create the pattern is also of importance whereby DOF is directly proportional to this wavelength while the aperture width is also directly proportional to the wavelength. Because of this dependency, it is clear that one of the approaches that can be used for improved line resolution is the use of smaller wavelength energy sources. Electron lithography makes use of this relation in using smaller wavelength at relatively high source energy. E-beam apparatus makes use of high-energy electrons to directly write a pattern onto a target surface. This leads to two concerns: the electrons that make up the E-beam must be propagated in a narrow and densely controlled beam while the sequential process of writing the pattern consumes a relatively large amount of time that is required to complete the writing of the pattern. The electrons, once they reach the target surface, may also be prone to scatter in a manner that is not conducive to creating a pattern of sub-micron dimensions.

A typical hardware and software configuration that makes up an E-beam system is rather elaborate and requires a considerable amount of software support to create image patterns with the capabilities of fast and error free patterns generation, pattern modification, and the like. Due to the nature of an E-beam configuration, the supporting hardware contains a number of components that are designed for electron beam control (such as the electron gun, which creates the electron beam) and a magnetic configuration that controls the electrons after release by the electron gun and before reaching the target surface. The control of the electron beam, once the beam has been emitted by the electron gun, takes place in an electron beam control column that contains such items of control as one or more lenses for the focusing of the electron beam in addition to one or more aperture masks to restrict the flow of electrons. The main operational parameters of an E-beam apparatus are the accelerating voltage that is applied to the stream of electrons, typically between about 10 and 50 KeV, and the cross section or size of the electron beam, typically between about 0.05 to 3 um. The E-beam apparatus thereby can be of a continuous write nature or it can be of a step and repeat nature containing various optical constructions. The performance parameters of an E-beam system are the feature size resolution, typically less than 0.1 um and the overlay accuracy, typically between about 0.005 and 0.4 um.

E-beam systems differ in the method that is used to project a desired pattern onto a target surface, two methods are essentially used for this purpose, that is raster scanning and vector scanning.

For the raster scanning approach, both the (scanning) E-beam and the target surface move with respect to each other such that the E-beam sweeps in an Y-direction while the underlying target surface moves in an X-direction, whereby the X and the Y direction perpendicularly intercept. The direction of the E-beam during its sweep in the Y-direction is controlled and made to follow the movement of the underlying target surface so that, during one complete sweep of the E-beam across the target surface, the vertical sweep of the E-beam addresses the same X-axis component of the underlying target surface. During the sweep of the E-beam, the stream of electrons is controlled by being interrupted and released in accordance with the pattern density that is required to be written on the target surface. It can be seen that, in this manner, the E-beam can access every point of the target surface and can imprint every point with an amount of electron beam energy that is under control of the E-beam apparatus.

Vector scanning uses an approach whereby a desired pattern in a target surface is decomposed into sub-exposures that are individually exposed by the E-beam onto the target surface. For each element of exposure, the E-beam is positioned on the target surface where that element is to be created after which the E- beam performs the exposure for that element. Immediately after this exposure is completed, the E-beam is directed towards the next element that needs to be exposed, the process continues in this manner in a repetitive fashion. It is not strictly required that sequential elements that are exposed constitute identical elements with identical E-beam exposure for the consecutive elements. E-beam exposure data can be fed to the E-beam control apparatus for each element that is exposed by the E-beam whereby however it is of value to consider, for reasons of throughput, that it may be of benefit the expose identical elements in a sequential stream of exposure. A number of vector scanning machines move the target surface in a step-and-repeat manner, allowing the exposure of larger surface areas. Positioning of the E-beam that is required for the step-and-repeat process does not have to be very accurate since the positioning of the target surface, which is monitored by a laser interferometer, can readily be indicated to the E-beam apparatus, which can then compensate small differences between actual and desired positioning of the target surface.

Further refinements have been introduced in the E-beam exposure approach that are aimed at improving image projecting capabilities of the E-beam system. One of these refinements uses a reduction in the number of exposures that need to be performed in order to create an image by controlling both the shape and the size of the electron beam. By shaping an electron beam that is rectangular in cross section but whereby the size of the cross section can be varied, the size of the exposure that is performed at one instance of exposure can be varied. Successive exposures are made whereby each of the successive exposures addresses portions of an image that needs to be created, by additive (superimposing on the target surface) exposures the actual image is created. This variable shape E-beam system uses two deflectors to control E-beam positioning and overlay. It is clear that this approach leads to rather complex system configurations, a complexity that only gets further empha- sized when the variable shape approach is further combined with adjustable positioning of the target surface.

Critical for methods of exposure when using E-beam apparatus is the method that is used to measure positioning of the E-beam with respect to other components of the system, most notably the target surface. Extreme accuracy is required for this exposure, this positioning capability is further implemented and supported by software functions that control other sub-sections of the E-beam apparatus that have an influence on the E-beam reaching the target surface. The method of the invention addresses this concern of accurate positioning.

E-beam technology further uses methods of creating patterns and images that are created by electron proximity and projection printing. Using these latter methods, a mask is applied whereby the distance between the mask and the target surface is about 1 mm. The E-beam is scanned over the entire surface of the chip-sized mask, openings in the mask allow the impinging electrons to penetrate the mask and subsequently strike the target surface. The masks that are applied using this method are relatively small resulting in a step-and-repeat process of exposure. This method creates detached opaque features (where they are required for proper exposure of a target surface) by using two complementary half-masks whereby alignment between these masks is performed using reference marks that are provided for this purpose on the surface of each chip.

With decreasing device feature size, it is increasingly difficult to use E-beam technology to create for instance very dense patterns of interconnect lines. It has already been stated that it is desirable to control the E-beam projection such that the electrons impact the target surface in a very dense and scatter free stream of electrons. Where this is not the case and where the electrons are scattered at the time of impact onto the target surface, line features will become blurred while, for small separations between adjacent features, electrons that are meant for one area will readily impact an immediately adjacent area. This effect is known as the proximity effect. This effect can partially be eliminated by adjusting exposure density to the proximity of the elements that are being exposed which however leads to increased complexity of E-beam control and E-beam data preparation. Any method therefore that allows for the reduction of the proximity effect is an improvement in the state of the art of E-beam applications. The method of the invention allows for reducing allowable proximity from 37 nm to 26 nm.

U.S. Pat. No. 5,808,892 (Tu) shows an E-beam method that evaluates the pattern fracturing based on the figures width.

U.S. Pat. No. 5,798,528 (Butsch et al.) teaches a VSB E-beam correction method.

U.S. Pat. No. 5,217,831 (White), U.S. Pat. No. 5,13,068 (Meiri et al.), U.S. Pat. No. 5,309,354 (Dick) and U.S. Pat. No. 5,254,438 (Owen et al.) show E-beam processes that improve Critical Dimension (CD).

SUMMARY OF THE INVENTION

A principle objective of the invention is to provide a method of E-beam and laser beam exposure wherein a dummy frame figure is formed outside the main unexposed pattern.

In accordance with the objectives of the invention a new method is provided for E-beam exposure. A new method is provided for variable shaped E-beam (VSB) and Gaussian laser and E-beam exposure systems. The conventional main pattern is, under the method of the invention involving VSB, surrounded on all sides by a dummy frame whereby the dummy frame limits the beam size of the exposure shots that are adjacent to the main pattern. All patterns that are created in this manner are therefore composites using the same exposure shot. This improves the Critical Dimension (CD) uniformity of the pattern by reducing the shot linearity error for VSB exposure systems. For Gaussian beam exposure systems, the exposure shots are at times located exactly over the exposed figure. Typically, gray level is used to simulate the small figure; this however induces proximity effects. The method of the invention therefore also improves the proximity effect of the Gaussian beam exposure systems.

BRIEF DESCRIPTION OF THE DRAWINGS

FIG. 1a shows the pattern of the invention for a smallest element that is created in an Y-direction, FIG. 1b shows the pattern of the invention for a smallest element that is created in an X-direction.

FIG. 2a shows a cross section of a semiconductor substrate over which layers of Cr or other opaque layer and photoresist have been created, the layer of photoresist is being exposed, FIG. 2b shows the cross section after the exposed layer of photoresist has been developed, FIG. 2c shows a cross section after the layer of Cr or other opaque layer has been etched in accordance with the pattern that has been created in the layer of photoresist, FIG. 2d shows a cross section after the patterned layer of photoresist has been removed, the process bias (dimension 39) equals the width of 36 minus the width of 34.

FIG. 3a shows a pattern of lines whereby the concept of the invention has not been applied, FIG. 3b shows the same pattern of lines that has been shown in FIG. 3a whereby the concept of the invention has been implemented.

DESCRIPTION OF THE PREFERRED EMBODIMENTS

In writing a pattern onto a target surface using E-beam systems, the pattern that is to be created is divided into smallest units referred to as "pixels" for Gaussian laser systems or as "shots" for variable shaped beam (VSB) exposures systems. A pixel or shot is the element that can be created in the target surface by a specified number of electrons that impact the target surface. A multiplicity of pixels or shots is joined to form a target pattern. An image can only be created in a target layer of for instance photoresist if a minimum number of electron impact the surface of the photoresist whereby this minimum number of electrons is dependent on the size of the pixel or shot that is to be created. Controlling the shape of the beam of electrons that impact the target surface can further control the number of electrons that impact onto a target surface. Typically, the electron beam has either a round (the Gaussian round beam), a fixed shaped beam or a variably shaped (Variable Shaped Beam or VSB) cross section. In using the Gaussian round shaped beam, the cross section of the beam is big compared to the smallest feature size that needs to be created, therefore requiring gray level to complete the smallest feature. For the variable shaped beam the electron beam can be shaped such that variable shaped patterns can be created using a minimum number of sweeps of the electron beam. The Gaussian round shaped electron beam, the fixed shaped electron beam and the VSB allow the creation of complex patterns whereby the exposure of the beam is directed to suit the to be created pattern. The Gaussian round beam requires a number of sweeps to create a pixel while the size of the fixed shaped beam and the VSB can be adjusted to create multiple pixels in one sweep. The CD uniformity of the pattern becomes poorly defined due to the linearity of different dimensions or sizes of exposure shots that can be obtained using the VSB system. The VSB system of the invention addresses this problem by providing a dummy frame at the outside of the VSB thereby eliminating the effects of poor definition due to the linearity of different dimensions of exposure shots.

In a VSB system, directing a uniform stream of electrons at a square aperture typically forms the electron beam. The image of the square aperture is then directed at a second square aperture. The cross section of the electron stream that exits the second square aperture is a rectangle. By varying the relative positioning of the first and the second square apertures, the cross section of the electron stream that exits the second square aperture can be controlled. By rotating the first square aperture with respect to the second square aperture, images other than rectangles such as triangles of various geometries can be created.

Figure 1A:
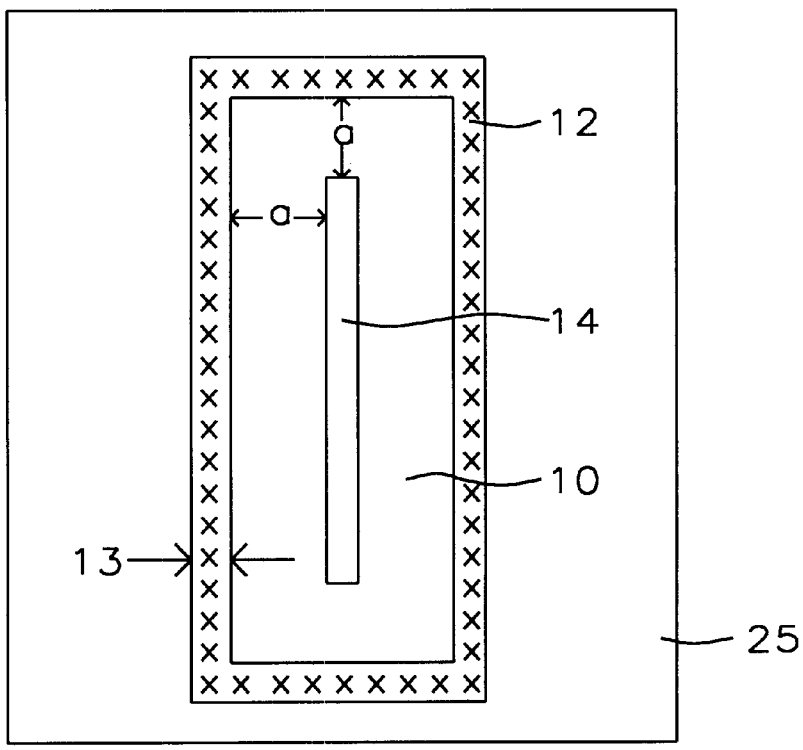
FIGS. 1a and 1b show a pattern of the invention that has as objective to improve Critical Dimension (CD) control for VSB E-beam systems and reduce the proximity effect for Gaussian laser beam and E-beam systems, as follows.

Referring now specifically to FIG. 1a, there is shown a top view of one exposure 10 to which a dummy dark frame 12 has been added. The exposure 10 is made into an underlying surface 25 that typically can be the surface of a semiconductor substrate. The feature highlighted as 14 is created in an Y-direction and is the feature that is to be created as part of a pattern. The addition of the dark frame 12 results in improved definition of the shot of the VSB which results in improved control of the linearity that can be allowed between adjacent elements that are exposed by the VSB. Control of the Critical Dimension (CD) of the pattern that can be created therefore applies to the pattern that needs to be created, that is to pattern 14. The cross section 13 of the dark edge 12 is determined by the process bias and is typically smaller than this process bias. The distance "a" between 12 and 14 is one designed shot for VSB or fixed pixels for the Gaussian system.

Figure 1B:
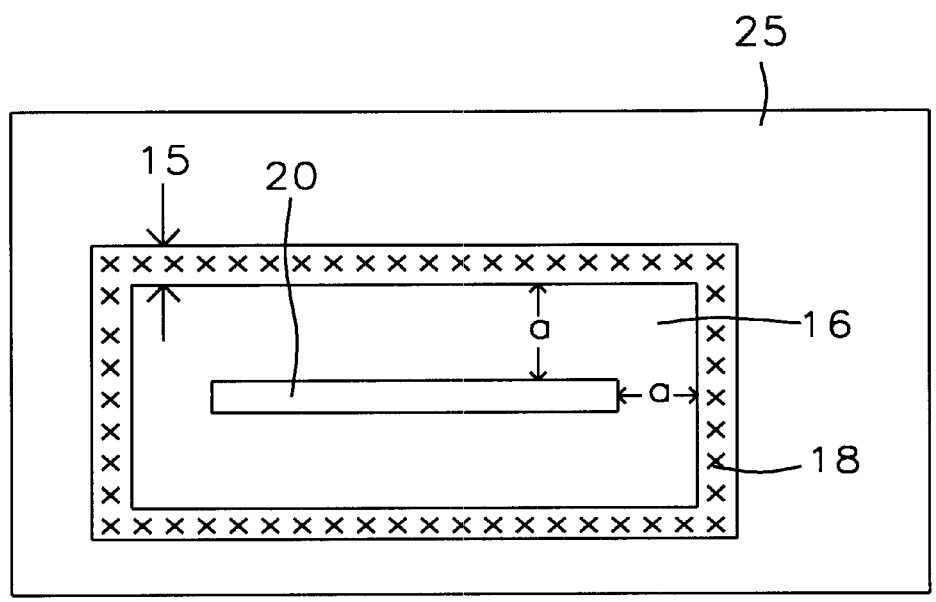

FIG. 1b shows a top view of one exposure 16 to which a dummy dark frame 18 has been added. The feature highlighted as 20 is created in an X-direction and is the feature that is to be created as part of a pattern. The exposure 16 is made into an underlying surface 25 that typically can be the surface of a semiconductor substrate. The addition of the dark frame 18 results in improved definition of the shot of the VSB which results in improved control of the linearity that can be allowed between adjacent elements that are exposed by the VSB. Control of the Critical Dimension (CD) of the element that can be created therefore applies to the pattern that needs to be created, that is to pattern 20. The cross section 15 of the dark edge 18 is determined by the process bias and is typically smaller than this process bias. The distance "a" between 18 and 20 is one designed shot for VSB or fixed pixels for the Gaussian system.

Figure 2A:
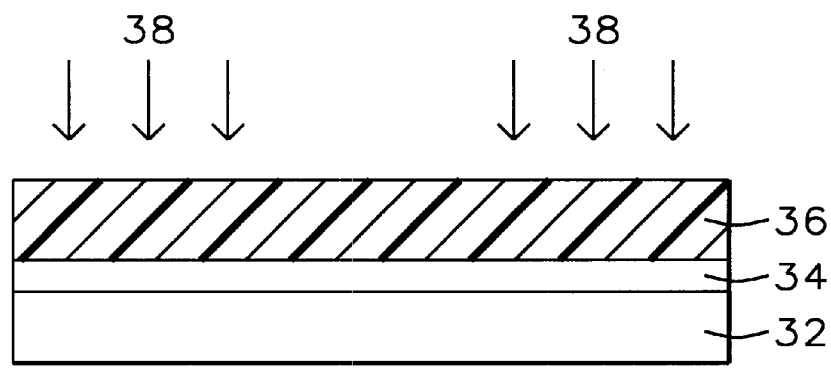
FIGS. 2a through 2d show the sequence of processing steps that explain the concept of process bias, as follows.
Figure 2B:
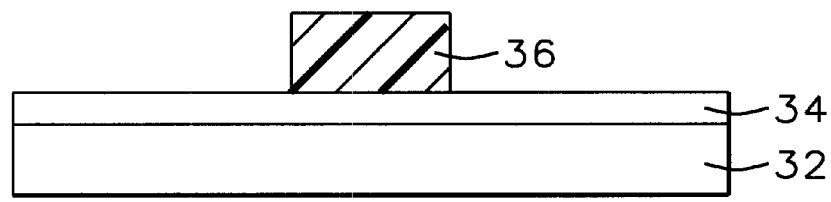
Figure 2C:
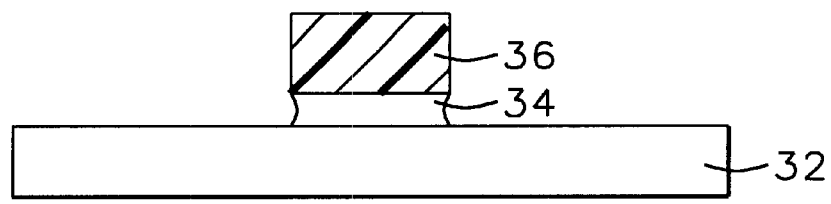
Figure 2D:
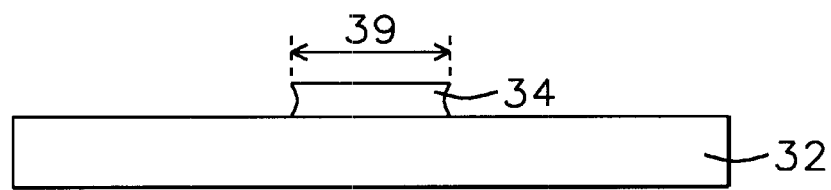

The concept of process bias is further explained in FIGS. 2a through 2d. FIG. 2a shows a cross section of a quartz surface 32, typically a semiconductor substrate, over which a layer 34 of Cr or any other opaque material is deposited. A layer 36 of photoresist is deposited over the surface of the layer 34 of Cr, the layer of photoresist is exposed (exposure 38) using conventional methods of photolithography. The layer 38 of photoresist is developed (FIG. 2b) thereby removing the photoresist from above the surface of layer 34 in accordance with the exposure pattern 38. The layer 34 of Cr is next etched (FIG. 2c) to remove the Cr in accordance with the pattern that has been created in the layer 36 of photoresist. As a final step in the process of creating the required Cr pattern on the surface of the substrate 32, the photoresist 36 is removed from above the patterned Cr (FIG. 2d) leaving a pattern 34 of Cr on the surface of substrate 32. The dimension 39 that is shown in FIG. 2d is the process bias that applies to the pattern 34 of Cr, this is the width of 36 minus the width of 34. This dimension 39 of process bias applies to the cross section of the to be created feature 14 and 20 that are shown in FIG. 1a and FIG. 1b respectively.

It must be noted that the dummy frame is smaller than or equal to the prevailing process bias so that, after processing, the dummy frame can be expected to automatically disappear. This implies that CD uniformity can be improved while there is no difference between the original pattern and the modified pattern after the process has been completed. This is reflected in the dimensions if the to be created feature 14 and 20 that have been highlighted under FIGS. 1a and 1b respectively. Test results have confirmed the basic premise of the process of the invention, that is that feature proximity can be improved by adding a dark dummy frame around the field of the main pattern. The following comparative test results have been taken by exposing an 11×11 array of Critical Dimension (CD) size device features using the same mask whereby these arrays where projected in both an X and an Y direction.

Test results that relate to feature exposure where the dark lines 12 (FIG. 1a) and 18 (FIG. 1b) are not applied are as follows, the first column presents the dimensions of the to be created features 14 and 20 in FIG. 1a and FIG. 1b respectively. dimension CD uniformity range

| dimension | CD uniformity range |
| --- | --- |
| 1.0 um | 58 nm |
| 1.1 um | 59 nm |
| 1.15 um | 89 nm. |

Test results that relate to feature exposure where the dark lines 12 (FIG. 1a) and 18 (FIG. 1b) are applied are:

| dimension | CD uniformity range |
| --- | --- |
| 1.0 um | 48 nm |
| 1.1 um | 49 nm |
| 1.15 um | 59 nm |

From the test results that are shown above it is clear that the addition of a dark dummy line surrounding the pattern 14 and 20 of exposure results in improved CD uniformity of adjacent features 14 and 20.

Figure 3A:
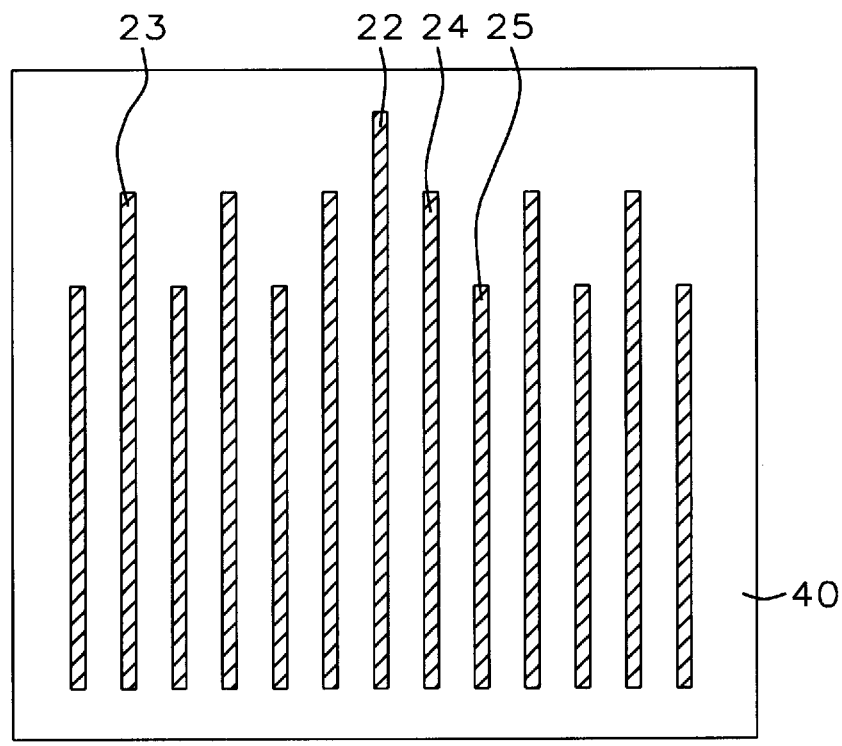
FIGS. 3a and 3b show experimental patterns that have been created to validate the concept of the invention, as follows.
Figure 3B:
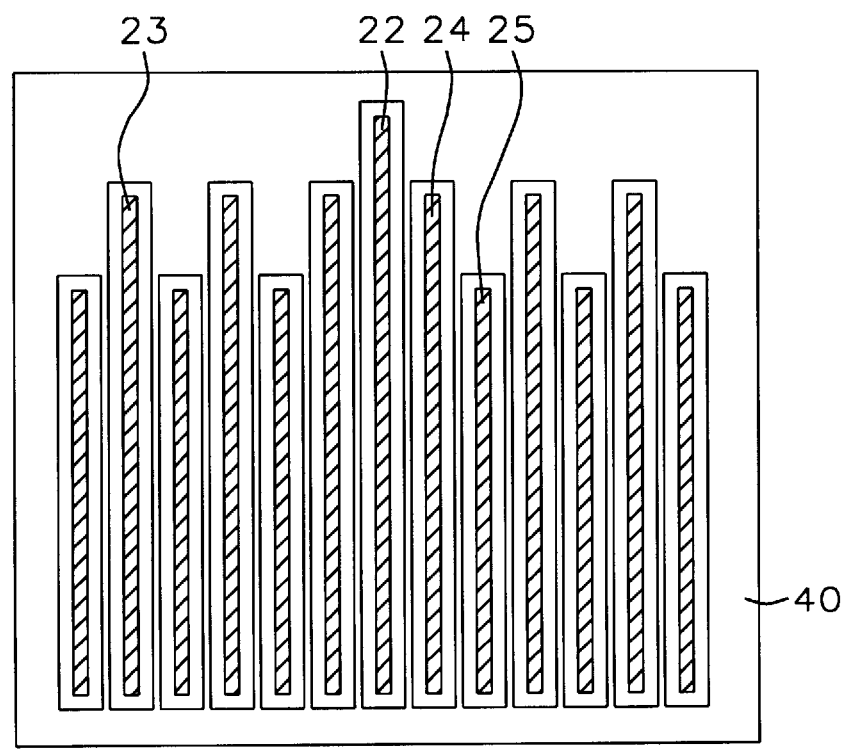

Further test results have been obtained using the method of the invention of applying a dark frame around the edge of a typical main pattern that relate to Gaussian laser beam and E-beam Exposure systems. FIGS. 3a and 3b show a pattern of lines that have been created in a semiconductor surface 40, typically the surface of a substrate. These tests were taken for different line densities whereby the conventional pattern (FIGS. 3a, with no dummy frame surrounding the exposure beam) and the pattern of the invention (FIG. 3b, with a dummy frame surrounding the exposure beam) have been applied. The measurements shown below reflect the impact that line density has on the width of the dark dummy pattern that is required to obtain acceptable critical dimensions of the features that are created. The results that have been obtained during these experiments are as follows, the second and third column present the dimensions of line 22, 23, 24 and 25 (FIGS. 3a and 3b) respectively. The feature density that is used for the measurements that are shown below is the exposed area divided by the local total surface area, the surface area being the area in which the exposures are made.

| line # (FIG. 3a) | feature density | original patt. dimension | meth. of the inv. dimension. |
| --- | --- | --- | --- |
| 22 | ~100% | 0.561 um | 0.570 um |
| 23 | 90% | 0.577 um | 0.585 um |
| 24 | 65% | 0.582 um | 0.588 um |
| 25 | 50% | 0.598 um | 0.596 um |

Incorporating the above listed results, it was confirmed as part of these measurements that, using the method of the invention, the critical dimension of the device features that are created can be improved to where they are in the range between about 37 nm and 26 nm.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for improving Critical Dimension (CD) uniformity and proximity between adjacent features created by electron beam exposure technology by providing a dummy frame surrounding a designed pattern, a width of a dummy frame being controlled by a process bias resulting in the dummy frame disappearing after creating a design patter, a distance between the dummy frame and a design pattern being one design shot for Variable Shaped E-beam (VSB) or fixed pixels for a Gaussian system.

2. The method of claim 1, said electron beam exposure technology comprising a system selected from the group consisting of E-beam systems and Gaussian laser-beam systems and Gaussian E-beam systems.

3. A computer based software support function, having as objective to create exposure data for patterns created by E-beam systems and Gaussian laser-beam systems and Gaussian E-beam systems, creating a dummy frame surrounding a design pattern, whereby:

said design pattern having a direction of length;

said design pattern having a dimension of line width in a direction perpendicular to said direction of length of said design pattern;

said design pattern having a dimension of line length in a direction that is parallel with said direction of length of said design pattern;

said design pattern having a shape of a rectangle, said rectangle having diagonals having a point of intercept;

said dummy frame being bounded by an inner rectangle and an outer rectangle, a longest side of said inner and said outer rectangle having a direction of length equal to said direction of length of said design pattern;

said inner rectangle of said dummy frame having diagonals having a point of intercept, said point of intercept of said diagonals of said inner frame coinciding with said point of intercept of said design pattern, centering said design pattern within said inner frame of said dummy frame;

a shortest side of said inner frame of said dummy frame having a dimension in a direction that is perpendicular to said direction of length of said inner frame of said dummy frame;

a longest side of said inner frame of said dummy frame having a dimension in a direction that is parallel with said direction of length of said inner frame of said dummy frame;

a shortest side of said outer frame of said dummy frame having a dimension in a direction that is perpendicular to said direction of length of said outer frame of said dummy frame;

a longest side of said outer frame of said dummy frame having a dimension in a direction that is parallel with said direction of length of said outer frame of said dummy frame;

said dimension of said shortest side of said outer frame of said dummy frame differing from said dimension of said shortest side of said inner frame of said dummy frame by a first positive increment;

said dimension of said longest side of said outer frame of said dummy frame differing from said dimension of said longest side of said inner frame of said dummy frame by a second positive increment;

said dimension of said shortest side of said inner frame of said dummy frame differing from said dimension of line width of said design pattern by a third positive increment; and said dimension of said longest side of said inner frame of said dummy frame differing from said dimension of line length of said design pattern by a fourth positive increment.

* * * * *